(12) United States Patent
Hsueh et al.

(10) Patent No.: US 7,941,916 B1
(45) Date of Patent: May 17, 2011

(54) MANUFACTURING METHOD FOR MEMORY CARD

(75) Inventors: Paul Hsueh, Concord, CA (US); Jim Ni, San Jose, CA (US); Kuang-Yu Wang, Saratoga, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 680 days.

(21) Appl. No.: 10/888,282

(22) Filed: Jul. 8, 2004

(51) Int. Cl.
*H05K 3/30* (2006.01)

(52) U.S. Cl. ............... 29/841; 29/830; 29/842; 29/855; 29/412; 29/417; 361/737

(58) Field of Classification Search .................. 29/841, 29/412, 417, 830, 832, 842, 855; 361/737
See application file for complete search history.

(56) References Cited

U.S. PATENT DOCUMENTS

| | | | |
|---|---|---|---|
| 5,563,769 A | 10/1996 | MacGregor | |
| 5,891,483 A | 4/1999 | Miyajima | |
| 6,040,622 A | 3/2000 | Wallace | |
| 6,102,743 A | 8/2000 | Haffenden et al. | |
| 6,166,913 A | 12/2000 | Fun et al. | |
| D445,096 S | 7/2001 | Wallace | |
| D452,690 S | 1/2002 | Wallace et al. | |
| D452,865 S | 1/2002 | Wallace et al. | |
| D453,934 S | 2/2002 | Wallace et al. | |
| 6,381,143 B1 | 4/2002 | Nakamura | |
| 6,399,906 B1 | 6/2002 | Sato et al. | |
| 6,410,355 B1 | 6/2002 | Wallace | |
| 6,462,273 B1 | 10/2002 | Corisis et al. | |
| 6,527,188 B1 | 3/2003 | Shobara et al. | |
| 6,624,005 B1 | 9/2003 | DiCaprio et al. | |
| 6,634,561 B1 | 10/2003 | Wallace | |
| 7,017,248 B2 * | 3/2006 | Choi et al. | ........... 29/402.08 |
| 7,089,661 B2 * | 8/2006 | Fong et al. | ............... 29/841 |
| 2002/0186549 A1 * | 12/2002 | Bolken | ............... 361/737 |

OTHER PUBLICATIONS

Marked up 7089661.*
Marked up 7089661 Aug. 15, 2006 (included in OA dated May 16, 2007.*

* cited by examiner

*Primary Examiner* — Rick K Chang
(74) *Attorney, Agent, or Firm* — Bever, Hoffman & Harms, LLP; Patrick T. Bever

(57) ABSTRACT

A portable memory card including a molded plastic casing formed over a memory device and other circuits mounted on a substrate such that the molding material extends over side edges of the substrate to provide accurate width and thickness dimensions. Contact pads are formed on a lower surface of the PCBA substrate, which is exposed through a bottom of the casing. The PCBA is fabricated on a substrate carrier, then positioned inside of a mold assembly. During the molding process, a rod extends from an upper portion of the mold assembly and pushes the substrate against the lower surface. A vacuum is then applied to hold the substrate against the lower surface of the mold, and the rod is subsequently withdrawn from the mold cavity during injection of the molten molding material. A single cavity mold assembly provides molding material extends over front and back edges of the memory card.

19 Claims, 9 Drawing Sheets

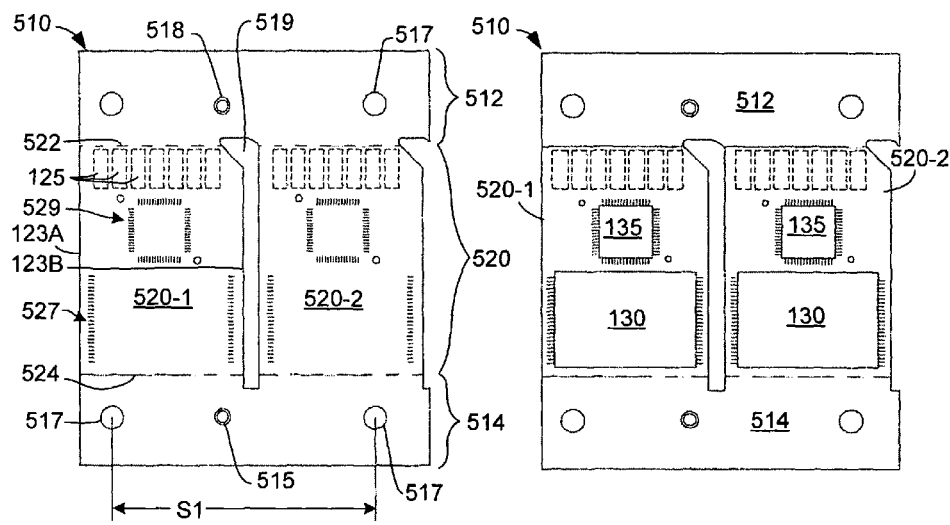
FIG. 5(A)  FIG. 5(B)
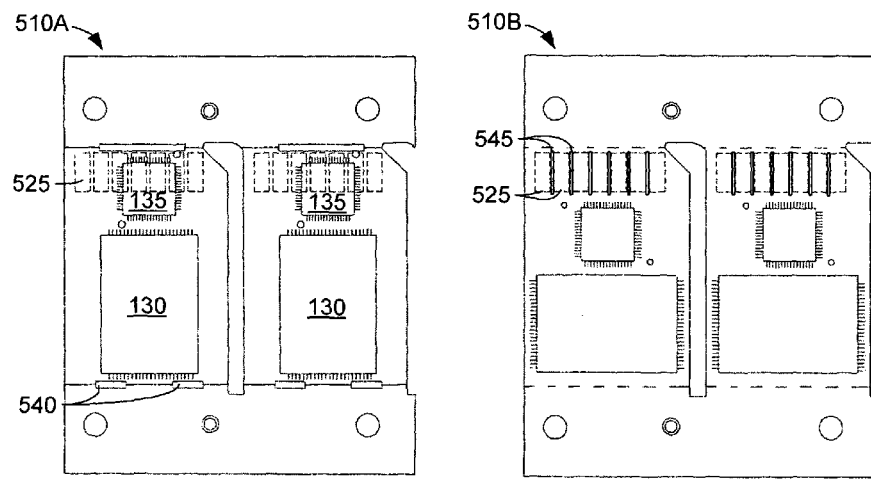
FIG. 6  FIG. 7

MANUFACTURING METHOD FOR MEMORY CARD

FIELD OF THE INVENTION

The present invention relates to a card-type electronic apparatus such as portable-type memory cards, and more particularly to methods for manufacturing such memory cards.

BACKGROUND OF THE INVENTION

A card-type electronic apparatus containing a memory device (e.g., an electrically erasable programmable read-only memory (EEPROM) or "flash" memory chip) and other semiconductor components is referred to as a memory card. Typical memory cards include a printed circuit board assembly (PCBA) mounted or molded inside a protective housing or casing. The PCBA typically includes a printed circuit substrate (referred to herein simply as a "substrate") formed using known printed circuit board fabrication techniques, with the memory device and additional components (e.g., control circuitry, resistors, capacitors, inductors, etc.) formed on an upper surface of the substrate (i.e., inside the casing), and one or more rows of contact pads exposed on a lower surface of the substrate. The contact pads are typically aligned in a width direction of the casing, and serve to electrically connect and transmit electrical signals between the memory chip/control circuitry and a card-hosting device (e.g., a computer circuit board or a digital camera). Examples of such portable memory cards include multi media cards (MMC cards) and personal computer memory card international association (PCMCIA) cards. An exemplary MMC card form factor is 24 mm wide, 32 mm long, and 1.4 mm or 1.5 mm thick, and is substantially rectangular except for a chamfer formed in one corner, which defines the front end of the card that is inserted into a card-hosting device. The card's contact pads are exposed on its lower surface of each card near the front end. These and other similar card-like structures are collectively referred to herein as "memory module cards" or simply as "memory cards".

An important aspect of most memory card structures is that they meet size specifications for a given memory card type. In particular, the size of the casing or housing, and more particularly the width and thickness (height) of the casing/housing, must be precisely formed so that the memory card can be received within a corresponding slot (or other docking structure) formed on an associated card-hosting device. For example, using the MMC card specifications mentioned above, each MMC card must meet the specified 24 mm width and 1.4/1.5 mm thickness specifications in order to be usable in devices that support this MMC card type. That is, if the width/thickness specifications of a memory card are too small or too large, then the card can either fail to make the necessary contact pad-to-card-hosting device connections, or fail to fit within the corresponding slot of the associated card-hosting device.

One conventional method for manufacturing memory cards that meet required size specifications includes using a cover or housing that is typically adhesively attached to the PCBA substrate over the semiconductor components. One shortcoming of this approach is that the thickness of such covers is necessarily relatively thick, and therefore takes up a significant amount of the specified memory card thickness (e.g., the 1.4 mm thickness of standard MMC cards). As a result, the choice of memory device and other components mounted used in these memory cards is limited to devices that are relatively thin. In addition, because such covers are fabricated separately and then attached to the substrate using an adhesive, the use of such separate covers increases production and assembly costs, and the covers can become detached from the substrate.

U.S. Pat. No. 6,462,273 discloses a second conventional MMC card fabrication process that avoids the thickness problems associated with separate cover structures by forming a molded casing over the PCBA components. First, the PCBA is assembled using normal practices by forming individual module substrates that are connected to a common carrier, with the material used for the carrier being the same as that of the module substrate. During a subsequent plastic molding process, round shaped rods are utilized for forming notches on the card body. Later, round shape cutters are cutting through the notched areas. If any connecting portion between the module and the carrier is not being cut clean, such that there are remaining silvers attached to the module, the silvers will not exist beyond the notch area and affect the card size specifications. Therefore, the card manufactured by this method has notches on the card body.

A problem with the manufacturing method disclosed in U.S. Pat. No. 6,462,273 is that the resulting memory card includes notches that reduce the usable area of the substrate in the width direction. In addition, portions of the substrate remain exposed in the notches after the carrier separation process, which further limits the use of the substrate in regions adjacent to the notches due to possible contamination and/or damage to the substrate in these regions.

What is needed is a method for producing memory cards that utilizes low-cost molding techniques to form rigid casing over a PCBA that maximizes the usable substrate area and avoids the contamination problems associated with conventional molding techniques.

SUMMARY

The present invention is directed to a method for manufacturing memory cards having a molded casing formed over a printed circuit board assembly (PCBA) in which the PCBA is position and secured in a molding assembly such that the mold cavity extends at least over the side edges of the PCBA substrate such that a portion of the lower surface is exposed along the peripheral edges of the substrate, and the PCBA substrate is securely held against the lower surface of the molding assembly to prevent molding material from forming on the bottom surface of the substrate. The memory cards produced by this method exhibit increased card capacity and functionality due to the increased available substrate area for mounting integrated circuits and other components. In addition, the molded casing provides a physically rigid memory card by filling gaps and spaces that are otherwise not filled when separate covers are used. In addition, the molded casing enables the use of a wide range of memory devices by allowing the casing material formed over the memory device to be made extremely thin, or omitted entirely.

According to an embodiment of the present invention, a single-cavity molding assembly is utilized to form memory cards one at a time. PCBAs are formed by mounting several IC components on an upper surface of a substrate that has several contact pads exposed its lower surface. In alternative embodiments, the memory device is arranged with its long axis extending across the substrate or along the long axis of the substrate. The PCBA is then positioned inside of mold assembly cavity such that a gap is provided between the peripheral edges of the substrate and the inside walls of the mold assembly (i.e., such that a portion of the mold assembly surface on which the PCBA is placed is exposed around the entire perimeter of the PCBA substrate). In various disclosed embodiments, positioning of the PCBAs is facilitated using one or more of a positioning block, retractable positioning rods, L-shaped corner blocks, and a pick-and-place machine. In alternative embodiments, one or more release films are interposed between the mold assembly and the PCBA. The substrate is then secured to the lower surface of the mold assembly using one or more of a retractable rod that extends downward onto the substrate at a point opposite to the contact pads, and by applying vacuum suction to the underside of the substrate. During subsequent injection of the molten molding material (e.g., plastic), the retractable rod is retracted to allow the cavity space taken up by the rod to be filled with molding material. After cooling, the PCBA, now having a molded casing formed over the IC components and extends from each edge of the substrate, is removed from the molding assembly and subjected to optional testing and labeling.

According to another embodiment of the present invention, a multi-cavity molding assembly is utilized to form several memory cards at a time. In this embodiment the PCBAs are formed by fabricating a carrier substrate having several spaced-apart substrate regions integrally attached to a carrier frame, and then mounting several IC components on an upper surface of each substrate region (contact pads are exposed the lower surface of each substrate region). The substrate carrier is then positioned inside of the multi-cavity mold assembly such that each substrate region is position inside of an associated cavity, and a gap is provided between the side edges of the substrate region and the inside walls of the associated cavity (i.e., such that a portion of the mold assembly surface on which the substrate region is placed is exposed along each side edge of the PCBA's substrate region). Positioning of the carrier substrate involves engaging protrusions formed on the molding assembly with positioning holes formed in the carrier frame. A release film is interposed between the mold assembly and an upper surface of the PCBA. Each PCBA is then secured to the lower surface of the mold assembly using one or more retractable rods that extend downward onto upper surface of each substrate region at a point opposite to the contact pads, and by applying vacuum suction to the underside of the substrate. During subsequent injection of the molten molding material into each cavity of the molding assembly, the retractable rods are retracted. After cooling, the substrate carrier is removed from the molding assembly, and the memory cards are separated from the carrier frame by cutting along the end edges of each substrate region.

BRIEF DESCRIPTION OF THE DRAWINGS

These and other features, aspects and advantages of the present invention will become better understood with regard to the following description, appended claims, and accompanying drawings, where:

FIGS. 5(A) and 5(B) are top views showing an exemplary substrate carrier utilized in the production of memory cards according to method of FIG. 4;

FIG. 6 is a top view showing another exemplary substrate carrier utilized in the production of memory cards according to method of FIG. 4;

FIG. 7 is a top view showing yet another exemplary substrate carrier utilized in the production of memory cards according to method of FIG. 4;

DETAILED DESCRIPTION OF THE DRAWINGS

Figures 1A, 1B, 1C:
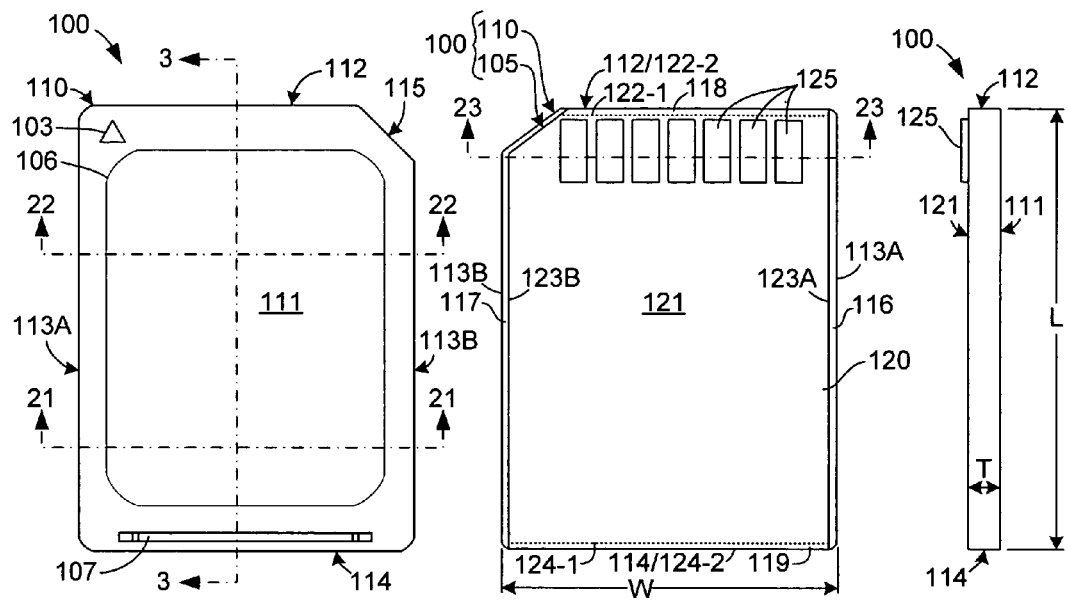
FIGS. 1(A), 1(B) and 1(C) are top, bottom, and side views of a memory card produced in accordance with an embodiment of the present invention.

FIGS. 1(A), 1(B), and 1(C) are top, bottom, and side views, respectively, showing an exemplary memory card 100 constructed in accordance with the present invention. Memory card 100 is also shown in various cross-sectional views in FIGS. 2(A), 2(B), and 2(C).

Referring to FIG. 1(B), memory card 100 includes a printed circuit board assembly (PCBA) 105 and a molded outer casing 110 that is formed over PCBA 105 in the manner described below such that a substrate 120 of PCBA 105 is partially exposed on the lower side of casing 110. As indicated in FIG. 1(A), casing 110 includes an upper surface 111, a front edge 112, side edges 113A and 113B, and a back edge 114. Casing 110 is substantially rectangular, except for a chamfer 115, which extends between front edge 112 and right side edge 113B. Chamfer 115 facilitates correct insertion of memory card 100 into a card-hosting device by preventing insertion with the lower side facing upward (i.e., the card-hosting device is constructed such that the full insertion of memory card 100 requires the proper orientation of chamfer 115). In the left upper corner (FIG. 1(A)), a triangular insertion direction mark 103 is provided for indicating the proper card insertion direction, and an optional identification label 106 is affixed in a central region of the upper surface. An optional ridge 107 is provided adjacent to back edge 114 to facilitate manual insertion and removal of memory card 100 from a card-hosting device.

Referring again to FIG. 1(B), substrate 120 includes an exposed lower surface 121, a front edge 122, side edges 123A and 123B, and a back edge 124 that combine to form a peripheral edge extending around a perimeter of substrate 120. According to alternative embodiments described in more detail below, front edge 122 is either offset from front edge 111 (indicated by dashed line 121-1), or is coincident with front edge 111 of casing 110 (indicated by reference numeral 122-2). Similarly, back edge 124 is either offset from back edge 114 (indicated by dashed line 124-1), or is coincident with back edge 114 of casing 110 (indicated by reference numeral 124-2). Side edges 123A and 123B are offset from casing side edges 113A and 113B, respectively, and a row of contact pads 125 are exposed on lower surface 121 of substrate 120 and arranged adjacent to front edge 122. Note that although contact pads 125 are indicated as extending from lower surface 121 (FIG. 1(C)) for illustrative purposes, these structures are substantially coplanar with lower surface 121. Also note that the seven contact pads 125 enable memory card 100 to transmit data according to "1 bit" set up. Alternative contact pad arrangements are discussed below.

As indicated in FIGS. 1(B) and 1(C), memory card 100 has a width W measured between side edges 113A and 113B of casing 110, a length L measured between front edge 112 and back edge 114, and a thickness T measured between upper surface 111 of casing 110 and lower surface 121 of substrate 120. Note that, of these specifications, the width W and the thickness T are the most sensitive, particularly adjacent to front edge 112, because variance of the width and thickness may alter the position of the memory card in a card-hosting device, or prevent insertion altogether (i.e., if the width W and/or thickness T are too large, thereby preventing insertion of the memory card into a corresponding receiving slot provided on the card-hosting device).

Referring again to FIG. 1(B), according to an aspect of the present invention, the molded material forming casing 110 includes an elongated first side portion 116 extending between side edge 123A of substrate 120 and side edge 113A of casing 110, and an elongated second side portion 117 extending between side edge 123B of substrate 120 and side edge 113B of casing 110. As discussed below, side portions 116 and 117 extend over side edges 123A and 123B of substrate 120.

Figure 2A:
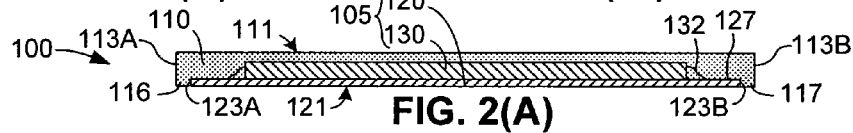
FIGS. 2(A), 2(B) and 2(C) are cross sectional views of the memory card of FIG. 1(A)-1(C) taken along section lines 21-21, 22-22, and 23-23, respectively, of FIGS. 1(A) and 1(B)
Figure 2B:
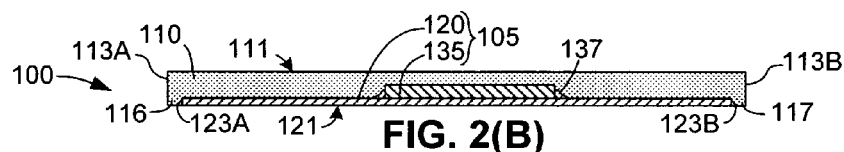
Figure 2C:
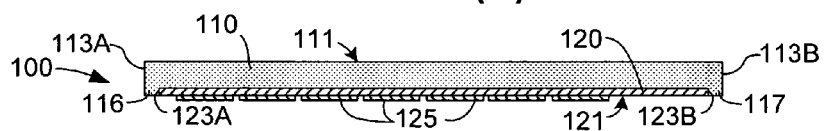

FIGS. 2(A), 2(B), and 2(C) are cross-sectional side views taken along section lines 21-21, 22-22, 23-23 of FIGS. 1(A) and 1(B), respectively. FIG. 2(A) shows molded casing 110 formed over PCBA 105, which includes substrate 120 and a memory device 130 (e.g., a "Flash" memory chip) that is electrically connected to an upper surface 127 of substrate 120, e.g., by bonding wires 132. FIG. 2(B) indicates that PCBA 105 also includes a control circuit 135 that is electrically connected to substrate 120 by bonding wires 137. Also mounted on substrate 110 are additional electronic components (e.g., capacitors, resisters, and other integrated circuits), which are omitted for illustrative purposes. Finally, FIG. 2(C) shows a cross section taken near the front edge of housing 110 and passing through contact pads 125. Note that in each of the cross-sections shown in FIGS. 2(A), 2(B), and 2(C), side portions 116 and 117 of casing 110 extend over side edges 123A and 123B of substrate 120, respectively. In addition, in each of the cross-sections shown in FIGS. 2(A) and 2(B), a portion of casing 110 extends above the upper surface of memory device 130 and control circuit 135. Because the molding process is more accurate and repeatable than the formation of substrate 120, memory card 100 provides a precise and reliable width dimension W and thickness dimension T (see FIGS. 1(B) and 1(C)) by accommodating slight variations in the width/height of substrate 120 and/or components 130 and 135. Further, by forming side portions 116 and 117 of casing 110 such that they extend over side edges 123A and 123B of substrate 120, respectively, memory card 100 provides a structure that resists damage due to delamination of substrate 120 from casing 100, and prevents exposure of substrate 120 to corrosive influences.

Figure 3A:
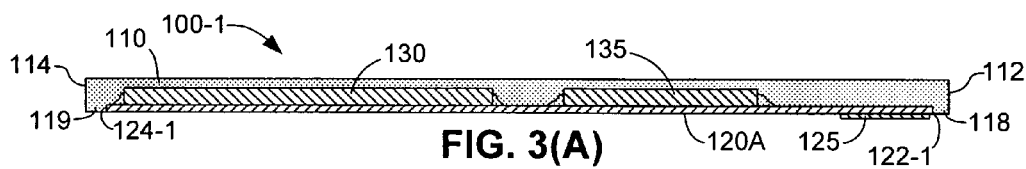
FIGS. 3(A) and 3(B) are cross-sectional views taken along section line 3-3 of FIG. 1(A) showing memory cards produced in accordance with alternative embodiments of the present invention.
Figure 3B:
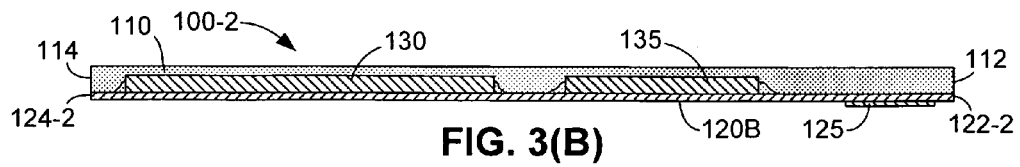

FIGS. 3(A) and 3(B) illustrate alternative cross-sectional views taken along section line 3-3 of FIG. 1(B). FIG. 3(A) shows a first memory card 100-1 formed in accordance with the first manufacturing method (described below) which provides end portions 118 and 119 of casing 110 that, similar to side portions 116 and 117 (discussed above), extend over and cover front edge 121-1 and back edge 124-1 of substrate 120, respectively. Although the length dimension L (see FIG. 1(C)) of memory card 100 is typically less critical than the width W and thickness T, the embodiment shown in FIG. 3(A) illustrates an embodiment in which the length dimension is accurately and repeatably generated, and provides the protective benefits discussed above. Alternatively, FIG. 3(B) illustrates a second memory card 100-2 formed in accordance with the second manufacturing method (described below) in which end portions are omitted, and where front edge 112 of casing 110 is coincident with front edge 122-2 of substrate 120 and back edge 114 of casing 110 is coincident with back edge 124-2 of substrate 120. Although the length dimension L (see FIG. 1(C)) of memory card 100-2 may be less accurate and repeatable than that of memory card 100-1, as described below the associated manufacturing method facilitates the simultaneous molding of several memory cards, thereby potentially decreasing production costs.

Figure 4:
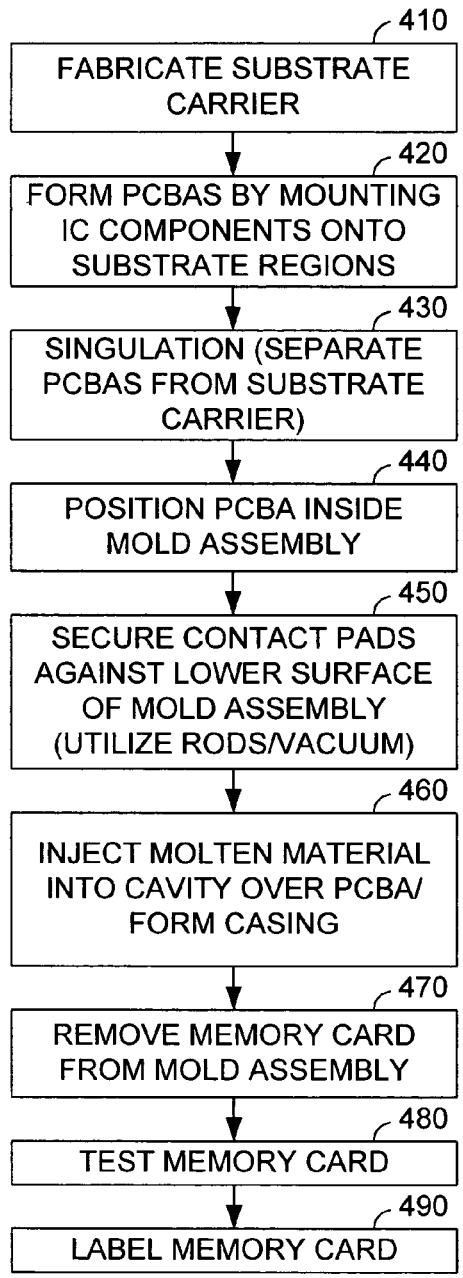
FIG. 4 is a flow diagram showing a memory card manufacturing method according to an embodiment of the present invention.

FIG. 4 is a flow diagram depicting a memory card manufacturing method according to a first embodiment of the present invention. The method depicted in FIG. 4 is directed to the manufacture of memory cards in which molding material extends over all peripheral edges of the PCBA substrate, such as the arrangement associated with memory card 100-1 (FIG. 3(A)). A second manufacturing method (described below) will describe the manufacture of memory cards in which molding material extends only over the side edges of the PCBA substrate, such as the arrangement associated with memory card 100-2 (FIG. 3(B)).

Referring to the upper portion of FIG. 4, the manufacturing process begins by forming a substrate carrier (block 410). An exemplary substrate carrier 510 is illustrated in FIG. 5(A), which includes a first carrier frame portion 512 and a second carrier frame portion 514, and a substrate region 520 extending between carrier frame portions 512 and 514. Located in substrate region 520 are multiple individual substrate sections (e.g., substrate sections 520-1 and 520-2) connected along a first end (indicated by dashed line 522) to carrier frame portion 512, and along a second end (indicated by dashed line 524) to carrier frame portion 514. According to an aspect of the present invention, carrier frame portions 512 and 514 and substrate regions 520-1 and 520-2 are simultaneously and integrally formed using conventional printed circuit board (PCB) techniques. For example, frame portions 512 and 514 and substrate regions 520-1 and 520-2 formed from multiple layers or an electrically insulating material, such as bismaleimide-triazine, epoxy resins, or polyamide resins, with substrate regions 520-1 and 520-2 including copper traces extending between the layers according to known PCB fabrication techniques to provide predetermined electrical connections. The number of layers and the thickness of each layer are selected based on predetermined dimensions. For example, in the exemplary embodiment described herein, total substrate thickness is approximately 0.2 to 0.3 mm thick.

According to an aspect of the present invention, substrate regions 520-1 and 520-2 are formed such that side edges 123A and 123B of each substrate region are entirely exposed during the subsequent molding process. For example, as indicated in FIG. 5(A), substrate region 520-1 includes side edges 123A and 123B. Side edge 123A defines the outermost edge of substrate carrier 510, and is therefore exposed along its entire length. In addition, substrate carrier 510 defines an elongated cutout region 519 that extends from carrier frame portion 512 to carrier frame portion 514 between first substrate region 520-1 and second substrate region 520-2, thereby exposing side edge 123B along the entire length of substrate region 520-2. Note that cutout region 519 includes an angled region adjacent carrier frame portion 512 that defines chamfer 115 (see FIG. 1(A)) in the completed memory card. Note that substrate regions 520-1 and 520-2 are similar in shape to the completed memory card, but are slightly smaller, and side edges 123A and 123B are formed with a rough (jagged) surface to facilitate the adherence of the molding material to form the proper edges of the completed memory card. Note that contact pads 525 (shown in hidden lines) are formed on a bottom surface of each substrate region, and in one embodiment, a plurality of through-holes (not shown) are provided between contact pads 525 for allowing molding material to form posts to further facilitate connection of the molding material to the substrate. Each substrate region includes bonding pads 527 exposed on the upper surface thereof for subsequently receiving memory device 130 (as shown in FIG. 5(B)) and bonding pads 529 for receiving control circuit 135 (also shown in FIG. 5(B)). Additional bonding pads (not shown) are provided for further components of the completed memory card. Finally, each carrier frame portion 510-1 and 510-2 includes several positioning holes 517 and markings 518 to facilitate the installation of the substrate onto various machines, as discussed below.

The carrier substrate illustrated in FIG. 5(A) is intended to be exemplary, and not limiting. For example, FIG. 6 illustrates an alternative substrate carrier 510A in which memory devices 130 are turned 90 degrees relative to the orientation shown in FIG. 5(A) such that the long axis of these memory devices in aligned in the length direction of the underlying substrate region. To accommodate this arrangement, control circuit 135 is moved upward (i.e., such that a portion of control circuit 135 is located directly over contact pads 125). One or more openings or slots 540 for facilitating separation (discussed below) without damaging connections to memory device 130. This arrangement adds strength and rigidity (i.e., bending resistance) to the completed memory card, thereby preventing damage due to rough handling. FIG. 7 illustrates another alternative substrate carrier 510B that is similar to substrate carrier 510 (FIG. 5(A)), but includes slots 545 that are defined in the substrate material between adjacent contact pads 525 such that the molten molding material fills these slots to further enhance adherence of the molding material to the substrate.

Referring again to FIG. 4, PCBAs are then formed by mounting various IC components onto substrate regions of the substrate carrier (block 420). In one embodiment, this mounting process involves passing the substrate carrier through a solder dispensing machine (not shown) such that the solder paste is dispensed onto each substrate region using known techniques. Next, the substrate strip is sent to an assembly machine (not shown) that utilizes markings 518 (see FIG. 5(A)) of the substrate carrier to facilitate indexing (alignment) of the substrate regions into the designated location inside the assembly machine. Next, the various electrical components (e.g., memory device 130, control circuit 135, capacitors, resisters and other IC devices) are mounted onto each substrate region by the assembly machine. Next, substrate carrier with assembled substrate regions is passed through an oven (not shown) to reflow the solder paste such that the component is soldered to the substrate according to known techniques, and is then allowed to cool. FIG. 5(B) depicts substrate carrier 510 at this stage of the manufacturing process (i.e., substrate regions 520-1 and 520-2, with memory devices 530 and control circuits 530 mounted thereon, are still attached to carrier frame portions 512 and 514).

Figure 8:
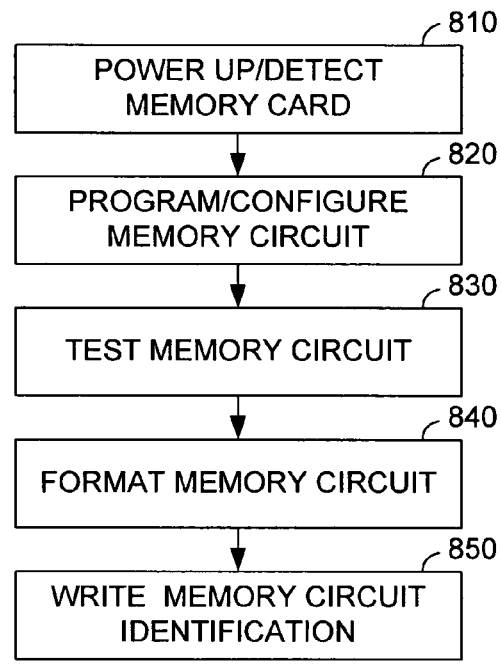
FIG. 8 is a flow diagram showing an optional test procedure utilized in the production of memory cards according to method of FIG. 4.

Before further processing, 510 may be subjected to an optional intermediate programming and test procedure, which is generally depicted in FIG. 8. In one embodiment, this program/test procedure involves contacting probes to predetermined regions of each substrate region to power up and detect each memory card device (block 810), and then programming the detected memory card circuit, for example, by writing test data into the memory device (block 820). The programmed memory card circuit is then tested, for example, by reading the previously stored data and comparing with known good data (block 840). In one alternative embodiment, the tested memory card circuit is formatted, for example, by writing all binary "0" values into the memory device (block 840), and/or subjected to an identification writing process in which identification information is written into special memory locations of the memory card circuit (block 850).

Referring again to FIG. 4, after the PCBAs are formed, a singulation process is performed in which the individual PCBAs are separated from the substrate carrier (block 430). Referring again to FIG. 5(A), this singulation process is performed, for example, by separating substrate regions 520-1 and 520-2 from carrier frame portions 512 and 514 by cutting along the dashed lines 522 and 524 utilizing a cutter according to known practices.

After singulation, the individual PCBAs are positioned in a mold assembly for plastic molding (block 440 of FIG. 4). In order to meet the memory card size specifications, the mold cavity size is made to the size specifications of the desired memory card (e.g., an MMC card). However, to facilitate the formation of mold portions 116 through 119 (discussed above with reference to FIG. 1(B)), the substrate size is made slightly smaller than the width and length of the mold cavity used to form the casing. Due to the offset between the peripheral edge (i.e., edges 122-1, 123A, 124, and 123B shown in FIG. 1(B)) of the substrate and the inside walls of the mold cavity, each PCBA must be precisely positioned inside the mold cavity.

FIGS. 9(A) through 11(B) illustrate several mold apparatus provided with mechanisms for precisely positioning each PCBA inserted therein, thereby facilitating the reliable production of memory cards having a casing that extends over the edges of the underlying PCBA substrate.

Figures 9A, 9B:
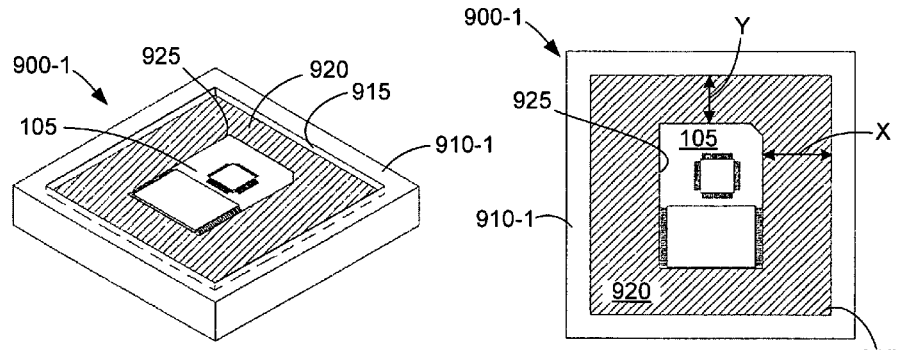
FIGS. 9(A) and 9(B) are perspective and top views showing a lower platen of an exemplary single-cavity molding assembly utilized to produce memory cards according to method of FIG. 4.

Referring to FIG. 9(A) and FIG. 9(B), a lower mold platen 910-1 of a mold assembly 900-1 defines a cavity portion 915 for receiving PCBA 105. However, before placing PCBA 105 therein, a positioning block 920 is inserted inside cavity portion 915 that defines a central cutout region 925 that is substantially the same shape as PCBA 105. In particular, positioning block 920 has an outer peripheral edge that is sized to fit tightly into cavity portion 915, which in turn places central cutout region 925 over the predetermined desired position for PCBA 105 to assume during the subsequent molding process. Accordingly, as indicated in FIG. 9(B), when PCBA 105 is placed inside central cutout region 925, PCBA 105 is aligned in the predetermined desired position (indicated by arrows X and Y) within mold cavity 915. Subsequently, positioning block 920 is removed from lower mold platen 910-1 of a mold assembly 900-1, thereby leaving PCBA 105 precisely positioned and ready for the next stage of the molding process (discussed below).

Figures 10A, 10B:
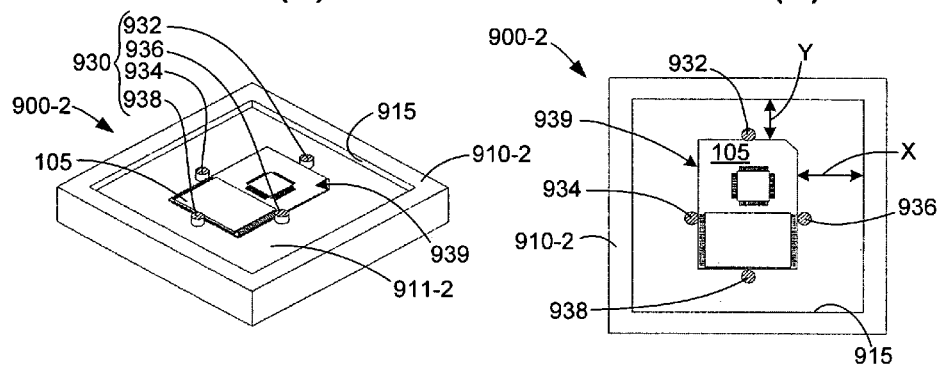
FIGS. 10(A) and 10(B) are perspective and top views showing a lower platen of another exemplary single-cavity molding assembly utilized to produce memory cards according to method of FIG. 4.

FIGS. 10(A) and 10(B) illustrate a PCBA positioning process according to an alternative embodiment in which a lower mold platen 910-2 of a mold assembly 900-2 includes a reciprocating assembly 930 including four positioning rods 932, 934, 936 and 938. Before placing PCBA 105 onto lower mold platen 910-2, positioning rods 932, 934, 936 and 938 are deployed (i.e., pushed through lower surface 911-2) into cavity portion 915. Note that, as indicated in FIGS. 10(A) and 10(B), positioning rods 932, 934, 936 and 938 define a central region 939 that corresponds to the predetermined desired position of PCBA 105. Accordingly, when PCBA 105 is subsequently dropped or otherwise inserted onto lower mold platen 910-2, positioning rods 932, 934, 936 and 938 serve to align PCBA 105 in the predetermined desired position, as indicated by arrows X and Y in FIG. 10(B). Subsequently, positioning rods 932, 934, 936 and 938 are retracted (i.e., drawn downward into lower mold platen 910-2 until the upper end of each rod is aligned with lower surface 911-2), thereby leaving PCBA 105 precisely positioned and ready for the next stage of the molding process (discussed below).

Figures 11A, 11B:
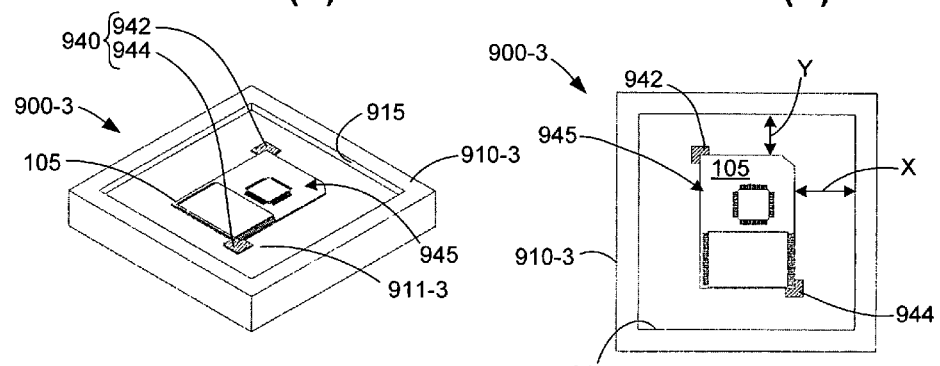
FIGS. 11(A) and 11(B) are perspective and top views showing a lower platen of yet another exemplary single-cavity molding assembly utilized to produce memory cards according to method of FIG. 4.

FIGS. 11(A) and 11(B) illustrate a PCBA positioning process according to yet another alternative embodiment in which a lower mold platen 910-3 of a mold assembly 900-3 includes another reciprocating assembly 940 including two L-shaped corner blocks 942 and 944. Before placing PCBA 105 onto lower mold platen 910-3, corner blocks 942 and 944 are deployed (i.e., pushed through lower surface 911-3) into cavity portion 915. Note that, as indicated in FIGS. 11(A) and 11(B), corner blocks 942 and 944 define a central region 945 that corresponds to the predetermined desired position of PCBA 105. Accordingly, when PCBA 105 is subsequently dropped or otherwise inserted onto lower mold platen 910-3, corner blocks 942 and 944 receive and align diagonal corners of PCBA 105, thereby placing PCBA 105 in the predetermined desired position, as indicated by arrows X and Y in FIG. 11(B). Subsequently, corner blocks 942 and 944 are retracted (i.e., drawn downward into lower mold platen 910-3 until the upper end of each rod is aligned with lower surface 911-3), thereby leaving PCBA 105 precisely positioned and ready for the next stage of the molding process (discussed below).

In yet another alternative embodiment, a precision pick-and-place machine is used to move and place PCBAs onto the lower mold platen of a mold assembly (i.e., without the aid of a positioning mechanism). In this embodiment, the pick-and-place machine is either pre-calibrated or utilizes known alignment techniques to place the PCBA at the predetermined desired position inside the lower platen of the mold assembly.

Upon completing the PCBA positioning process according to one of the embodiments described above, an upper platen of the mold assembly is moved over and engaged with the lower platen such that the PCBA is enclosed in a cavity defined by the upper and lower platens.

Referring again to FIG. 4, after the PCBA is precisely positioned inside of the mold assembly and the mold assembly is closed, according to another aspect of the present invention, one or more mechanisms are utilized to secure the PCBA to prevent shifting (displacement) of the PCBA before or during the molding process (block 450), and then molten molding material is injected into the mold cavity over the PCBA (block 460). The securing process is utilized to prevent displacement of the PCBA inside the mold cavity during the injection of molten molding material (e.g., plastic). The follow paragraphs describe several, mechanisms that are utilized, either alone or in combination, to perform this securing process.

Figure 12:
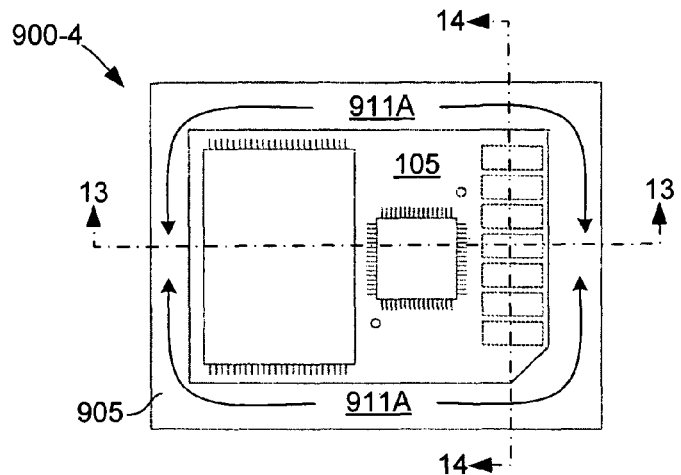
FIG. 12 is a simplified top view showing another exemplary single-cavity molding assembly utilized to produce memory cards according to method of FIG. 4.
Figure 13:
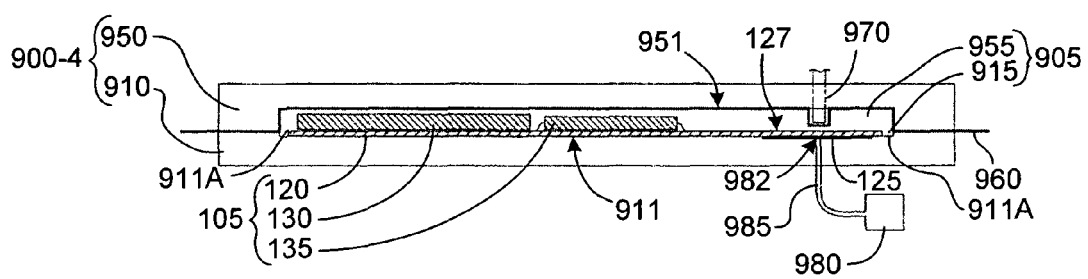
FIG. 13 is a cross-sectional view taken along section lines 13-13 of FIG. 12.
Figure 14:
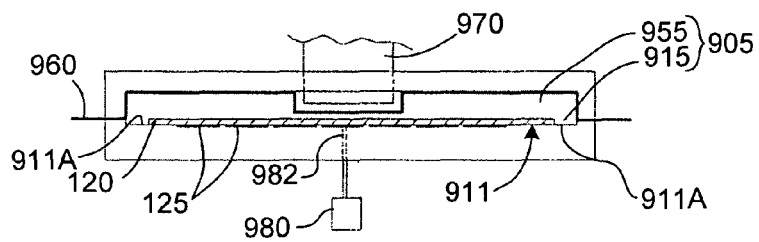
FIG. 14 is a cross-sectional view taken along section lines 14-14 of FIG. 12.

FIG. 12 is a top plan view depicting a portion of a simplified mold assembly 900-4 with a PCBA 105 enclosed therein, and FIGS. 13 and 14 are cross-sectional side views taken along section lines 13-13 and 14-14 of FIG. 12. As indicated in FIG. 13, mold assembly includes a lower platen (portion) 910 and an upper platen (portion) 950. Although not shown, it is understood that lower platen 910 supports any of the positioning mechanisms according to the various embodiments described above. Note also that lower platen 910 and upper platen 950 are depicted as being transparent in these figures for illustrative purposes, and are typically made of metal (e.g., aluminum).

Referring to FIG. 13, mold assembly 900-4 defines a cavity 905 including lower cavity portion 915, which is defined by lower platen (portion) 910, and an upper cavity portion 955 that is defined by upper platen 950. Upper platen 950 is connected to a gate (not shown), which is in turn connected by a delivery channel (not shown) to a reservoir (not shown) containing molten molding material (e.g., melted plastic resin). As indicated in FIGS. 12, 13 and 14, PCBA 105 is placed on lower surface 911 of lower platen 910 and positioned within cavity 905 such that lower cavity portion 915 extends entirely around substrate 120 of PCBA 105 (i.e., such that a lower surface portion 911A is exposed around the entire periphery of substrate 120). As described below, during the subsequent molding process, this peripheral cavity region facilitates the formation of peripheral casing portions 116, 117, 118 and 119 (discussed above with reference to FIG. 1(B)).

According to an embodiment of the present invention, a plastic release film 960 is utilized for reducing the "flash", a plastic ridge usually formed around the gaps between the moving components such as ejector pins and the mold platen. Such plastic films are disclosed in U.S. Pat. No. 5,891,483, which is, incorporated herein in its entirety. Referring to FIGS. 13 and 14, plastic release film 960 is interposed between a lower surface 951 of upper platen 950 and PCBA 105 (i.e., when upper platen 950 and lower platen 910 are clamped together, plastic release film 960 is positioned above PCBA 105). While the usage of release film 960 enhances the formation of the memory module casing by reducing flashes, it is not mandatory.

According to an embodiment of the present invention, the position of PCBA 105 is secured within cavity 905 using at least one of a spring-loaded retractable rod 970 and a vacuum source 980. Retractable rod 970 is retractably (movably) mounted in upper platen 950, and controlled such that a dull end of rod 970 is selectively extended into cavity 905 to push a portion of release film 960 against upper surface 127 of substrate 120 at a point opposite to (i.e., directly over) contact pads 125. Because rod 970 is spring-loaded and has a dull end, when rod 970 is pressed downward against release film 960 and upper surface 127, the pressure is firm but does not puncture release film 960, and does not damage substrate 120. By pressing against upper surface 127 in this manner, substrate 120 is held against lower surface 911 of lower platen 910, thereby securing PCBA 105 within cavity 905. In addition (or in the alternative), lower platen 910 defines a plurality of through-holes 982 that are communicated with vacuum source 980 via one or more channels 985. The vacuum force applied to the lower surface of substrate 120 via throughholes 982 securely holds substrate 120 against lower surface 911 of lower platen 910, thereby leaving no gap through which molten molding material may form undesirable plastic structures over contact pads 12 that can prevent proper operation of the memory card. Subsequently, when the pressurized molten plastic flows into mold cavity 905, the molten plastic begins to fill cavity 905. After the plastic fills the majority of cavity 905, rod 970 is retracted, and PCBA 105 is held in place solely by the vacuum force exerted on contact pads 125, and the molten plastic fills the remainder of cavity 905 and completely covers memory device 130, control circuit 135 and other components exposed on upper surface 127 of PCBA 105.

Referring back to FIG. 4, after an appropriate cooling down period, the molded memory card is removed from the mold assembly (block 470), subjected to an optional testing procedure (block 480), and finally subjected to an optional labeling and/or packaging process according to known practices (block 490). Note that completed memory card produced by the manufacturing method of FIG. 4 is shown in FIGS. 1(A) and 1(B), and is consistent with memory card 100-1 of FIG. 3(A), which, as described above, includes end casing portions 118 and 119. The optional testing procedure is performed, for example, utilizing the procedure shown in FIG. 8 and described above. Labeling and/or packaging are performed according to known practices.

While the manufacturing method according to the embodiment described above provides a casing that reliably and accurately meets length, width, and thickness specifications, the manufacturing method of FIG. 4 is restricted to producing only one memory card per mold assembly in order to provide casing material around the entire perimeter of the PCBA substrate.

Figure 15:
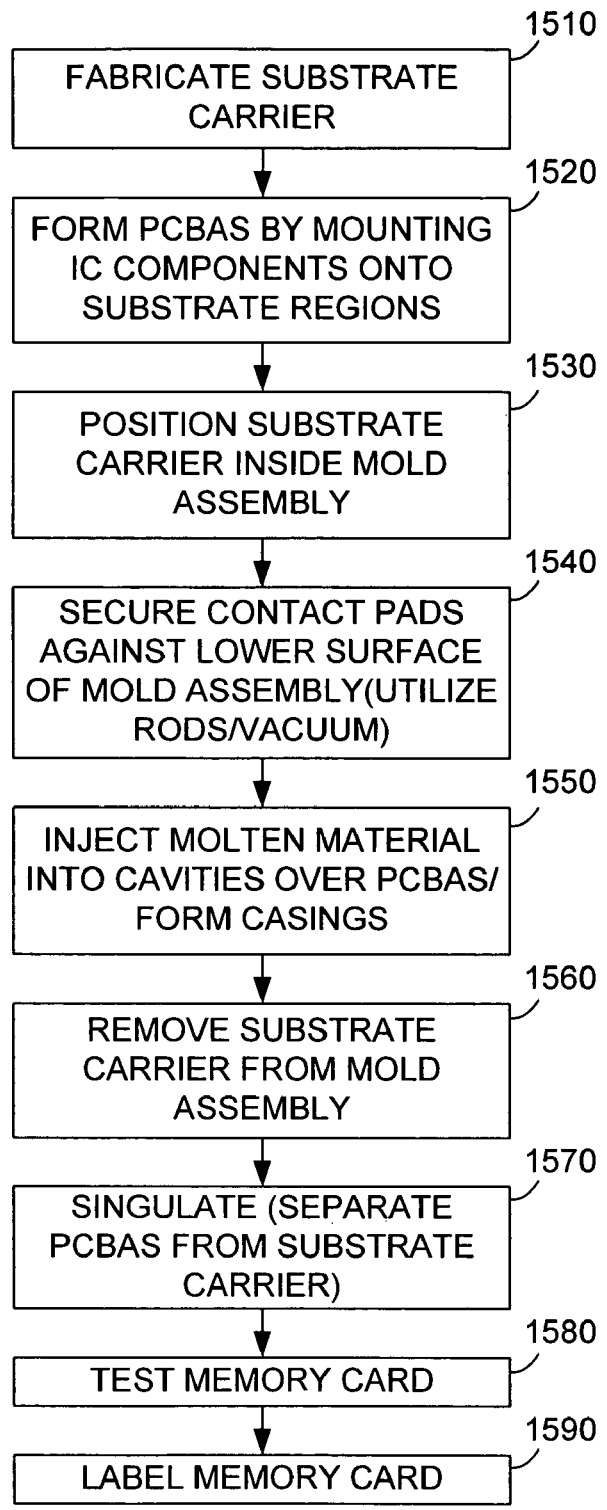
FIG. 15 is a flow diagram showing a memory card manufacturing method according to another embodiment of the present invention.

FIG. 15 is a flow diagram depicting a memory card manufacturing method according to another embodiment of the present invention in which multiple memory cards are produced in each molding assembly during each molding process, thereby increasing production quantities and reducing manufacturing costs. Note that completed memory card produced by the manufacturing method of FIG. 15 is consistent with memory card 100-2 of FIG. 3(B), which omits end casing portions (such as portions 118 and 119 of memory card 100-1, shown in FIG. 3(A)). Accordingly, the method depicted in FIG. 15 is directed to the manufacture of memory cards in which molding material extends only over the side peripheral edges of the PCBA substrate, thereby providing memory cards that have highly precise width and thickness dimensions (see FIGS. 1(B) and 1(C)), but whose length dimension may vary slightly from card to card.

Referring to the upper portion of FIG. 15, the manufacturing process begins by forming a substrate carrier (block 1510), and forming PCBAs on the substrate portions of the substrate carriers (block 1520) in substantially the same manner as described above. For simplicity, the manufacturing method associated with the second embodiment is described below with reference to exemplary substrate carrier 510, which is described in detail above with reference to FIGS. 5(A) and 5(B). The use of substrate carrier 510 in the following description is intended to be exemplary and not limiting. After fabrication of the substrate carrier is completed, the various memory card circuits are subjected to an optional testing process in a manner similar to that described above.

Figure 16:
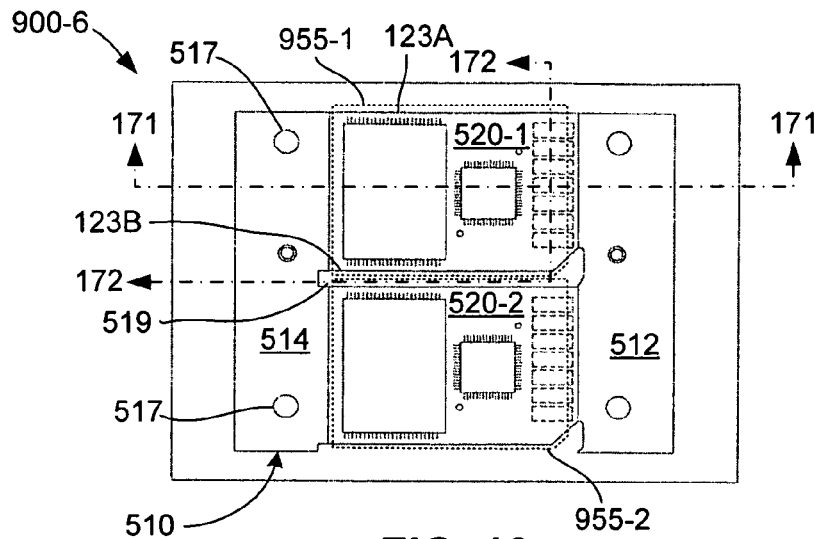
FIG. 16 is a simplified top view showing an exemplary multi-cavity molding assembly utilized to produce memory cards according to method of FIG. 15.
Figure 17A:
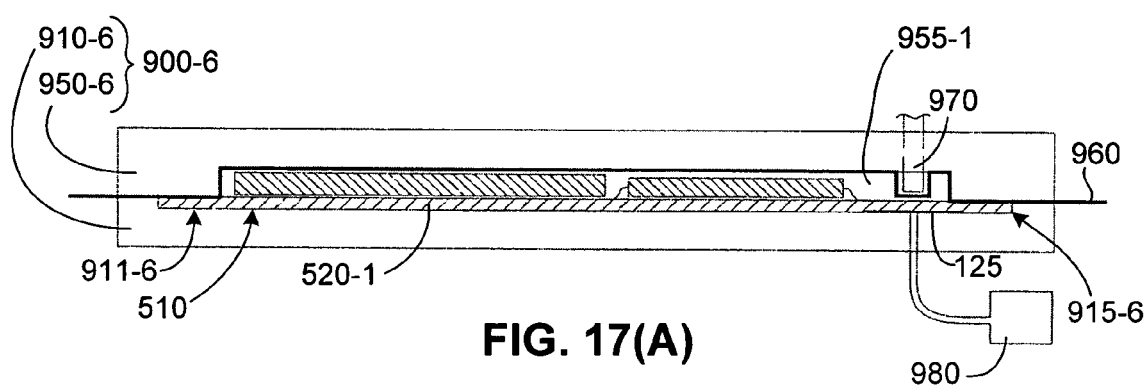
FIGS. 17(A) and 17(B) are cross-sectional views taken along section lines 171-171 and 172-172, respectively, of FIG. 16.
Figure 17B:
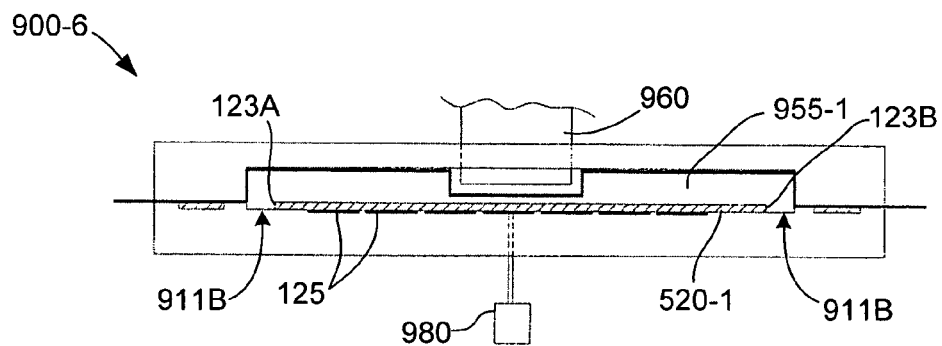

Referring again to FIG. 15, the substrate carrier is then positioned inside of a multi-cavity molding assembly (block 1530). FIG. 16 is a simplified top view showing an exemplary multi-cavity molding assembly 900-6 according to an embodiment of the present invention. FIGS. 17(A) and 17(B) are cross-sectional views taken along section lines 171-171 and 172-172 of FIG. 16. As indicated in FIGS. 17(A) and 17(B), molding assembly 900-6 includes a lower platen 910-6 and an upper platen 950-6 that are connected together to enclose substrate carrier 510 during the molding process. Substrate carrier 510 is positioned into one or more lower cavities 915-6 defined by lower platen 910-6, and is positioned using pins (not shown) that protrude upward from a surface 911-6 and are received in holes 517 formed in carrier frame portions 512 and 514 (see FIG. 16). That is, these pins are spaced with the same spacing S1 (see FIG. 5(A)) as holes 517, and serve to hold PCBAs (substrate regions) 520-1 and 520-2 in the proper X-Y alignment during the molding process. In one embodiment, the depth of lower cavities 915-6 is the same as that of the thickness of the substrate carrier 510. Upper platen 950-6 defines several cavities 955-1 and 955-2 (shown in dashed lines in FIG. 16) that are respectively positioned over PCBAs 520-1 and 520-2 such that each cavity extends over opposing side edges of an associated substrate region (e.g., as indicated in FIG. 17(B), cavity 955-1 extends over side edges 123A and 123B of substrate region 520-1) such that a portion (e.g., portion 911B) of lower surface 911-6 is exposed along each side edge of the associated substrate region. Note that, as in the previously described embodiment, each cavity 955-1 and 955-2 of upper platen 950-6 is connected via a gate and channel (not shown) to a reservoir (not shown) containing molten plastic resin.

Referring back to FIG. 15, after the substrate carrier is positioned and the molding assembly is closed, the contact pads of each PCBA is secured against the lower surface of the molding assembly (block 1540). This securing process is essentially the same as that described above, and in one embodiment involves utilizing one or more of retractable rods 970 and vacuum source 980 in the manner described above. Note also that optional release film 960 is provided between upper platen 950-6 and substrate carrier 510.

After the substrate carrier is secured, molten molding material is injected into the various cavities to form casings over the PCBAs (block 1550), with rod 970 being retracted into upper platen 950-6 when a majority of the cavity is filled in the manner described above. After cooling down period, the substrate carrier with molded memory cards still attached thereto removed from the molding apparatus (block 1560), and then subjected to a singulation process in which the individual molded memory cards are cut along the end edges (e.g., lines 522 and 524 in FIG. 5(A)) from the carrier frame (block 1570). Note that completed memory card produced by the manufacturing method of FIG. 15 is consistent with memory card 100-2 of FIG. 3(B), which, as described, above, does not include end casing portions. Next, each of the thus separated memory cards is subjected to an optional testing procedure (block 1580), and finally subjected to an optional labeling and/or packaging process according to known practices (block 1590) in the manner described above.

As set forth above, the present invention facilitates the production of memory cards using a variety of different memory device types by allowing the casing thickness formed over the memory device (and other components) to be adjusted, or entirely eliminated, during the molding process. For example, FIGS. 18(A) through 18(H) illustrate several memory cards that utilize different memory devices, substrates, and casing arrangements. Flash memory devices that are suitable for MMC type memory cards, are manufactured, for example, by Samsung (Korea), and the semiconductor chip packages and dies are contained within Thin Small Outline Package (TSOP packages) and Very Very Thin Small Outline Package (WSOP packages). Further, these package types are available in several series:

"K9F series"—Single Die with Single Chip Select—WSOP or TSOP

"K9F series"—Dual Die with Single Chip Select—WSOP or TSOP

"K9W series"—Quart Die stacked with Dual Chip Select—TSOP

Figure 18A:
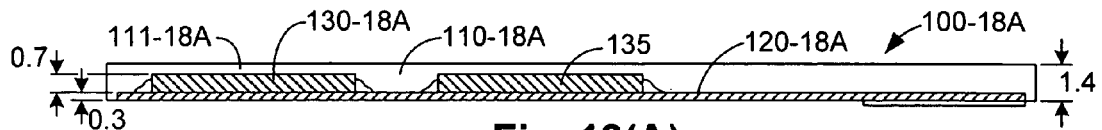
FIGS. 18(A), 18(B), 18(C), 18(D), 18(E), 18(F), 18(G) and 18(H) are simplified cross-sectional side views showing memory cards having a variety of memory device and substrate configurations.

Referring to FIG. 18(A), a card 100-18A includes a WSOP memory device 130-18A and a Controller 135-18A installed on the substrate 120-18A and enclosed by a casing 110-18A. As indicated, memory card 100-18A is 1.4 mm thick, the WSOP memory device 130-18A is 0.7 mm thick, substrate 120-18A is 0.3 mm thick, and the casing (plastic) material portion 111-18A formed above WSOP memory device 120-18A being 0.4 mm thick.

Figure 18B:
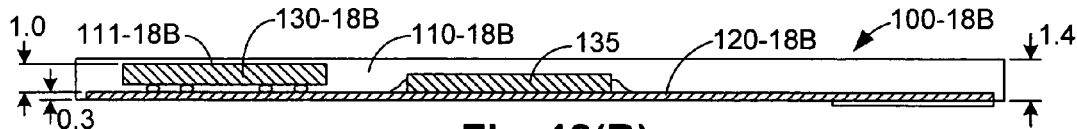

Referring to FIG. 18(B), a card 100-18B includes a Ball Grid Array (BGA) memory device 130-18B and a Controller 135-18B installed on the substrate 120-18B and enclosed by a casing 110-18B. As indicated, memory card 100-18B is 1.4 mm thick, the BGA memory device 130-18B is 0.7 mm thick, substrate 120-18B is 0.3 mm thick, and the casing (plastic) material portion 111-18B formed above WSOP memory device 120-18B being 0.1 mm thick.

Figure 18C:
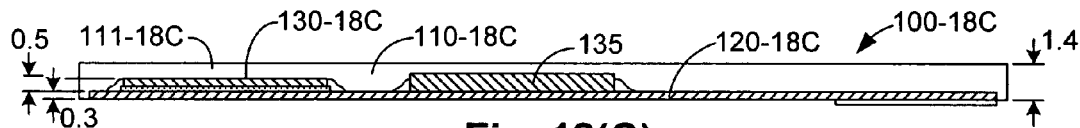

Referring to FIG. 18(C), a card 100-18C includes a DIE memory device 130-18C and a Controller 135-18C installed on the substrate 120-18C and enclosed by a casing 110-18C. As indicated, memory card 100-18C is 1.4 mm thick, the DIE memory device 130-18C is 0.5 mm thick, substrate 120-18C is 0.3 mm thick, and the casing (plastic) material portion 111-18C formed above WSOP memory device 120-18C is 0.6 mm thick.

Figure 18D:
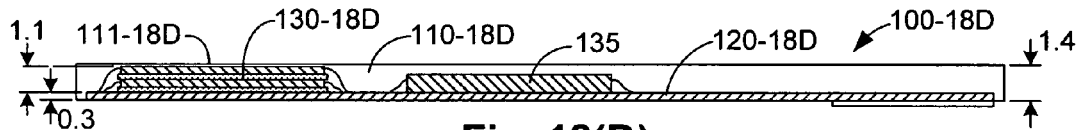

Referring to FIG. 18(D), a card 100-18D includes two stacked DIE memory devices 130-18D and a Controller 135-18D installed on the substrate 120-18D and enclosed by a casing 110-18D. This arrangement provides twice the memory capacity, and the associated stacking technique is disclosed, for example, in U.S. Pat. No. 6,542,393 which is incorporated herein by reference in its entirety. As indicated, memory card 100-18D is 1.4 mm thick, each DIE memory device 130-18D is 0.5 mm thick, substrate 120-18D is 0.3 mm thick, and the casing (plastic) material portion 111-18D formed above WSOP memory device 120-18D is 0.1 mm thick.

Figure 18E:
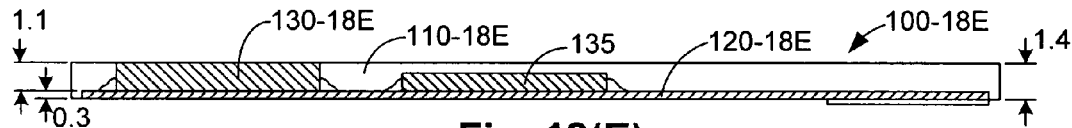

Referring to FIG. 18(E), a card 100-18E includes A TSOP memory device 130-18E and a Controller 135-18E installed on the substrate 120-18E and enclosed by a casing 110-18E. As indicated, memory card 100-18E is 1.4 mm thick, TSOP memory device 130-18E is 1.1 mm thick, substrate 120-18E is 0.3 mm thick, and TSOP memory device 130-18E is exposed through the upper surface of casing 110-18E.

Figure 18F:
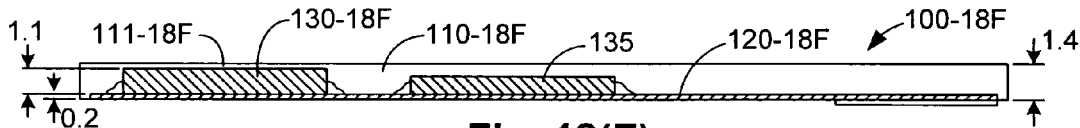

Referring to FIG. 18(F), a card 100-18F includes a TSOP memory device 130-18F and a Controller 135-18F installed on the substrate 120-18F and enclosed by a casing 110-18F. As indicated, memory card 100-18F is 1.5 mm thick, TSOP memory device 130-18G is 1.1 mm thick, substrate 120-18G is 0.2 mm thick, and the casing (plastic) material portion 111-18G formed above TSOP memory device 120-18G is 0.1 mm thick.

Figure 18G:
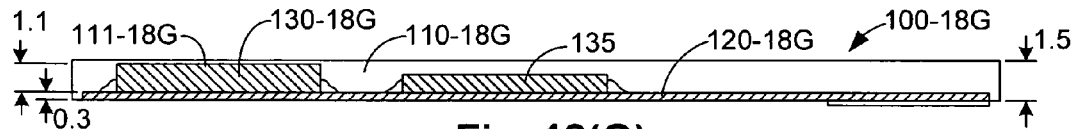

Referring to FIG. 18(G), a card 100-18G includes a TSOP memory device 130-18G and a Controller 135-18G installed on the substrate 120-18G and enclosed by a casing 110-18G. As indicated, memory card 100-18G is 1.5 mm thick, TSOP memory device 130-18G is 1.1 mm thick, substrate 120-18G is 0.3 mm thick, and the casing (plastic) material portion 111-18G formed above WSOP memory device 120-18G is 0.1 mm thick.

Figure 18H:
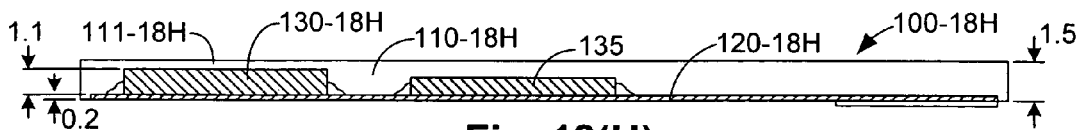

Referring to FIG. 18(H), a card 100-18H includes a TSOP memory device 130-18H and a Controller 135-18H installed on the substrate 120-18H and enclosed by a casing 110-18H. As indicated, memory card 100-18H is 1.5 mm thick, TSOP memory device 130-18H is 1.1 mm thick, substrate 120-18H is 0.2 mm thick, and the casing (plastic) material portion 111-18H formed above TSOP memory device 120-18H is 0.2 mm thick.

In addition to the various memory cards described above with reference to FIGS. 18(A) to 18(H), any semiconductor package thickness that is equal or less than the illustrated semiconductor package thickness can be used in lieu of the illustrated packages and mounted to the substrate. Also, a flexible circuit board can be used instead of the illustrated rigid circuit board.

Figure 19A:
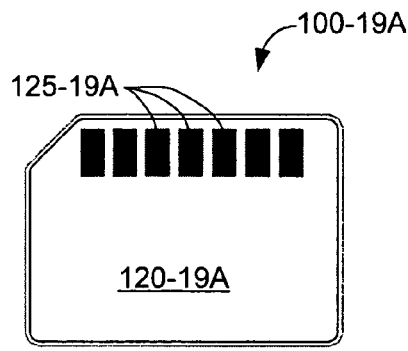
FIGS. 19(A), 19(B), 19(C), 19(D), and 19(E) are bottom plan views showing memory cards formed in accordance with the present invention that have a variety of card sizes and contact pads arrangements.
Figure 19B:
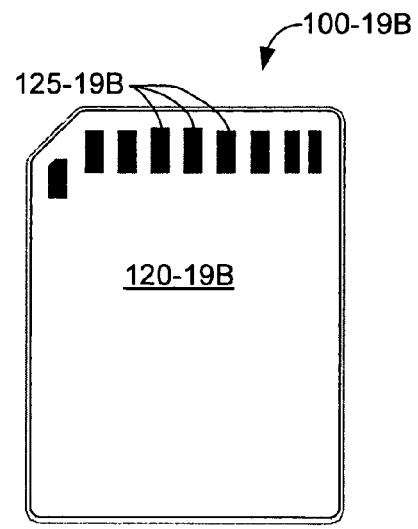
Figure 19C:
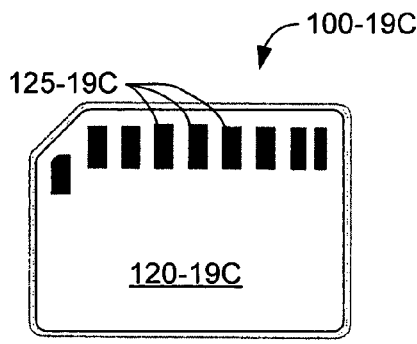
Figure 19D:
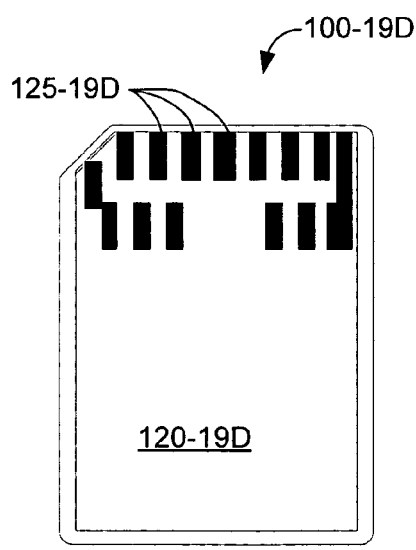
Figure 19E:
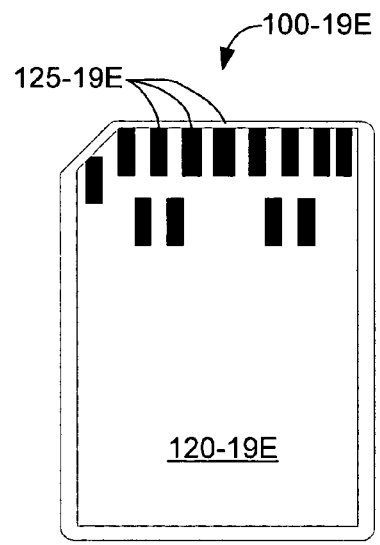

By maximizing the usable substrate surface, the present invention also facilitates shorter card lengths, as well as increased performance and functionality of the manufactured memory cards, which in turn supports increased data transmission rates. For example, FIGS. 19(A) through 19(E) are bottom views showing various memory cards having various card lengths and contact pad arrangements that can be utilized due to the increased functionality of the manufacturing method of the present invention. FIG. 19(A) shows a memory card 100-19A that includes seven contact pads 125-19A arranged in the single row arrangement described above, but includes a substantially shortened substrate 120-19A. Note that the evolving applications for certain types of memory cards have made it necessary to provide increased transmission rates by providing nine and thirteen contact pad arrangements without increasing the memory card size. FIG. 19(B) shows another memory card 100-19B that utilizes a "normal" length substrate 120-19B, but includes nine contact pads 125-19B that facilitate communication with a host device using a "4 bit" I/O transmission (i.e., 4 bits transmitted in parallel during each cycle). FIG. 19(C) shows another memory card 100-19C that utilizes both a "shortened" length substrate 120-19C and nine contact pads 125-19C arranged for "4 bit" I/O transmissions. FIG. 19(D) shows yet another memory card 100-19D that utilizes a "normal" length substrate 120-19D and thirteen contact pads 125-19D that facilitate communication with a host device using an "8 bit" I/O transmission. Finally, FIG. 19(E) shows yet another memory card 100-19E, which is essentially identical to the one shown in FIG. 19(D), except that the leftmost and rightmost pads on $2^{nd}$ row have been substantially reduced in size. The substrate 120-19E is of normal length and the thirteen contact pads 125-19E are arranged for "8 bit" I/O transmissions. Note that each of the memory cards shown in FIGS. 19(A) through 19(E) exhibit the same width and thickness specifications as the "normal" seven contact pad memory cards described above.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for manufacturing a memory card comprising:
   forming a printed circuit board assembly (PCBA) including a substrate having a plurality of IC components mounted on an upper surface thereof and a plurality of contact pads exposed on a bottom surface thereof, wherein the substrate has a continuous peripheral edge extending around an entire perimeter thereof and excludes tie bars that extends from the peripheral edge away from the substrate;
   positioning the PCBA inside of a cavity defined by a mold assembly, the mold assembly having a lower mold portion having a lower surface for receiving the PCBA, and an upper mold portion mounted over the PCBA, wherein the cavity extends over the continuous peripheral edge of the substrate such that a portion of the lower surface is exposed around the entire perimeter of the substrate;
   securing the substrate to the lower surface of the mold assembly such that the bottom surface of the substrate is held against the lower surface of the lower mold portion; and
   injecting molten material into the cavity such that the molten material forms a casing over the IC components, whereby molten material flows over the continuous peripheral edge of the substrate and contacts the exposed portion of the lower surface of the lower mold portion, thereby forming casing portions that cover the continuous peripheral edge of the substrate and extend over the entire perimeter of the substrate, wherein the substrate is secured during said injecting such that molten material is prevented from forming on the bottom surface of the substrate.

2. The method according to claim 1, wherein forming the PCBA comprises:
   fabricating a substrate carrier including the substrate integrally formed with a carrier frame, wherein the carrier frame includes a first frame portion connected to a first end of the substrate, and a second frame portion integrally connected to a second end of the substrate; and
   mounting said plurality of IC components onto the substrate to form a printed circuit board assembly (PCBA).

3. The method according to claim 2,
   wherein the plurality of IC components includes a rectangular memory device defining a long axis, and
   wherein mounting the IC components comprises aligning the long axis of the memory device in a width direction of the substrate.

4. The method according to claim 2,
   wherein the plurality of IC components includes a rectangular memory device defining a long axis, and
   wherein mounting the IC components comprises aligning the long axis of the memory device in a length direction of the substrate.

5. The method according to claim 2, wherein fabricating the substrate comprises forming at least one slot between the carrier frame and each substrate.

6. The method according to claim 2, wherein fabricating the substrate comprises forming slots between adjacent contact pads.

7. The method according to claim 2, wherein forming the PCBA further comprises separating the PCBA from the carrier frame by cutting along the first and second ends of the substrate.

8. The method according to claim 1, wherein positioning the PCBA inside the mold assembly comprises:
   placing a positioning block inside of the mold assembly;
   inserting the PCBA into a central cutout region defined by the positioning block, wherein the central cutout region is aligned with a predetermined desired position of the PCBA; and
   removing the positioning block from the mold assembly.

9. The method according to claim 1, wherein positioning the PCBA inside the mold assembly comprises:
   deploying a plurality of positioning rods such that the positioning rods protrude into a lower cavity region of the mold assembly;
   inserting the PCBA into a central region defined by the plurality of positioning rods, wherein the central region is aligned with a predetermined desired position of the PCBA; and
   retracting the positioning rods such that the positioning rods are positioned outside of the lower cavity region.

10. The method according to claim 1, wherein positioning the PCBA inside the mold assembly comprises:
    deploying a plurality of L-shaped corner blocks such that the corner blocks protrude into a lower cavity region of the mold assembly;
    inserting the PCBA into a central region defined by the corner blocks, wherein the central region is aligned with a predetermined desired position of the PCBA; and
    retracting the corner blocks such that the corner blocks are positioned outside of the lower cavity region.

11. The method according to claim 1, wherein positioning the PCBA inside the mold assembly comprises utilizing a pick-and-place machine to place the PCBA into a predetermined desired position inside a lower mold portion of the mold assembly.

12. The method according to claim 1, wherein positioning the PCBA inside the mold assembly comprises interposing a release film between an upper mold portion of the mold assembly and the PCBA.

13. The method according to claim 1, wherein securing the PCBA comprises inserting a rod into the cavity such that the rod contacts the upper surface of the substrate at a point opposite to the contact pads.

14. The method according to claim 13, wherein securing the PCBA inside the mold assembly further comprises applying a vacuum force to the bottom surface of the substrate, thereby holding the substrate against the lower surface of the lower mold portion.

15. The method according to claim 14, further comprising retracting the rod from the cavity during injection of the molten material into the cavity.

16. The method according to claim 1, wherein securing the PCBA inside the mold assembly comprises applying a vacuum force to the bottom surface of the substrate, thereby holding the substrate against the lower surface of the lower mold portion.

17. The method according to claim 1, further comprising removing the memory card from the mold assembly, and performing at least one of testing the memory card and labeling the memory card.

18. The method according to claim 1, wherein forming the PCBA comprises mounting on an upper surface of the substrate a controller device and a memory device formed in at least one of a Very Very Thin Small Outline Package (WSOP), a Ball Grid Array (BGA) package, and a Thin Small Outline Package (TSOP).

19. The method according to claim 1, wherein forming the PCBA comprises the substrate with one of seven, nine, and eleven contact pads.

* * * * *